United States Patent
Sun

(10) Patent No.: US 10,116,289 B2
(45) Date of Patent: Oct. 30, 2018

(54) SIGNAL PROCESSING CIRCUIT FOR MITIGATING PULLING EFFECT AND ASSOCIATED METHOD

(71) Applicant: MEDIATEK INC., Hsin-Chu (TW)

(72) Inventor: Chih-Hao Sun, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/738,941

(22) Filed: Jun. 15, 2015

(65) Prior Publication Data

US 2016/0164464 A1    Jun. 9, 2016

Related U.S. Application Data

(60) Provisional application No. 62/089,805, filed on Dec. 9, 2014.

(51) Int. Cl.
| | |
|---|---|
| *G06G 7/12* | (2006.01) |
| *H03D 7/14* | (2006.01) |
| *H04B 1/04* | (2006.01) |
| *H03K 5/00* | (2006.01) |
| *H03D 7/00* | (2006.01) |

(52) U.S. Cl.
CPC .......... *H03K 5/00006* (2013.01); *H03D 7/00* (2013.01); *H03D 2200/009* (2013.01)

(58) Field of Classification Search
CPC . H03K 5/00006; H03D 7/00; H03D 2200/009
See application file for complete search history.

(56) References Cited

U.S. PATENT DOCUMENTS

| 5,870,670 A * | 2/1999 | Ripley .................. H03D 7/165 |
|---|---|---|
| | | 455/304 |
| 6,321,074 B1 | 11/2001 | Lemay |
| 6,850,749 B2 | 2/2005 | Soorapanth et al. |
| (Continued) | | |

FOREIGN PATENT DOCUMENTS

| CN | 101354439 A | 1/2009 |
|---|---|---|
| CN | 103595406 A | 2/2014 |
| CN | 102570983 A | 1/2015 |

OTHER PUBLICATIONS

Weldon et al, "A 1.75 GHz Highly Integrated Narrow Band CMOS Transmitter With Harmonic-Rejection Mixers", IEEE Journal of Solid State Circuits, vol. 36, No. 12, Dec. 2001.*

*Primary Examiner* — Kenneth B Wells
(74) *Attorney, Agent, or Firm* — Wolf, Greenfield & Sacks, P.C.

(57) ABSTRACT

A signal processing circuit has a first mixer, a first amplifier, and a pulling effect mitigation circuit. The first mixer mixes a first input signal and a first oscillation signal to generate a first output signal, wherein the first oscillation signal is generated by dividing a frequency of a reference clock with a frequency dividing factor. The first amplifier amplifies the first output signal, and generates an amplified output signal at an output terminal of the first amplifier. The pulling effect mitigation circuit is coupled to the output terminal of the first amplifier, and generates a compensation signal to the output terminal for reducing at least an $N^{th}$ harmonic of the amplified output signal, wherein a value of N is equal to the frequency dividing factor.

10 Claims, 4 Drawing Sheets

(56) References Cited

U.S. PATENT DOCUMENTS

| | | | |
|---|---|---|---|
| 7,509,110 B2* | 3/2009 | Hayashi | H03D 7/1441 |
| | | | 455/302 |
| 8,044,734 B2 | 10/2011 | Lane | |
| 8,285,240 B2* | 10/2012 | Seendripu | H03D 3/007 |
| | | | 455/303 |
| 8,538,366 B2* | 9/2013 | Rafi | H03D 7/00 |
| | | | 375/345 |
| 8,681,838 B2 | 3/2014 | Manku | |
| 8,694,039 B2* | 4/2014 | Jalloul | H04B 7/0805 |
| | | | 455/161.3 |
| 9,071,197 B2* | 6/2015 | Vora | H03D 7/166 |
| 9,172,337 B2* | 10/2015 | Un | H03F 3/193 |
| 9,264,096 B2* | 2/2016 | Arima | H04B 1/7097 |
| 9,337,945 B2* | 5/2016 | Imai | H04N 5/455 |
| 9,369,261 B2* | 6/2016 | Furuta | H04B 1/0475 |
| 2006/0202767 A1 | 9/2006 | Nayler | |
| 2008/0139150 A1 | 6/2008 | Li et al. | |
| 2010/0003943 A1 | 1/2010 | Seendripu et al. | |
| 2010/0026395 A1 | 2/2010 | Lane | |

* cited by examiner

SIGNAL PROCESSING CIRCUIT FOR MITIGATING PULLING EFFECT AND ASSOCIATED METHOD

CROSS REFERENCE TO RELATED APPLICATIONS

This application claims the benefit of U.S. provisional application No. 62/089,805 filed on Dec. 9, 2014.

BACKGROUND

The present invention relates to a signal processing circuit, and more particularly, to a signal processing circuit for mitigating pulling effect, and an associated method.

In a traditional transmitter system, a local oscillator (LO) signal is needed for up-converting a baseband signal (a data signal to be transmitted) to generate an up-converted signal such as a radio frequency (RF) signal. When a frequency FLO of the LO signal is obtained by dividing a frequency FVCO of a voltage controlled oscillator (VCO) signal with a frequency dividing factor of 2 (i.e. FLO=FVCO/2), a second harmonic of the up-converted signal will have a frequency that is twice the fundamental frequency of the up-converted signal and is close to the frequency FVCO of the VCO signal. As a result, the second harmonic of the up-converted signal may affect the VCO signal through magnetic coupling between a transformer in the transmitter system (e.g. a balun (balanced-to-unbalanced) transformer) and an inductor of the VCO. Due to this pulling effect, the VCO signal may not be the required perfect sine wave and may cause Error Vector Magnitude (EVM) degradation.

Thus, there is a need for an innovative design capable of effectively mitigating the pulling effect to ensure the signal transmission quality.

SUMMARY

One of the objectives of the present invention is to provide a signal processing circuit and associated method for effectively solving the above-mentioned problem.

According to a first aspect of the present invention, a signal processing circuit is disclosed. The signal processing circuit includes a first mixer, a first amplifier, and a pulling effect mitigation circuit. The first mixer is arranged to mix a first input signal and a first oscillation signal to generate a first output signal, wherein the first oscillation signal is generated by dividing a reference clock with a frequency dividing factor N. The first amplifier is coupled to the first mixer, and arranged to amplify the first output signal and generate a first amplified output signal at an output terminal of the first amplifier. The pulling effect mitigation circuit is coupled to the output terminal of the first amplifier, and arranged to generate an out-of phase compensation signal to the output terminal for reducing at least an $N^{th}$ harmonic of the first amplified output signal, wherein a value of N is equal to the frequency dividing factor.

According to a second aspect of the present invention, a signal processing method is disclosed. The signal processing method includes: mixing a first input signal and a first oscillation signal to generate a first output signal, wherein the first oscillation signal is generated by dividing a reference clock with a frequency dividing factor N; amplifying the first output signal and generating a first amplified output signal; and generating an out-of phase compensation signal to the output terminal for reducing at least an $N^{th}$ harmonic of the first amplified output signal, wherein a value of N is equal to the frequency dividing factor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

To protect a clock source (e.g. a VCO) from experiencing the pulling effect due to a high-power transmission signal, a transmitter design may be configured to use a higher VCO frequency which is far from the frequency of the second harmonic of the high-power transmission signal. This method requires a large VCO current and divider current, however. Another transmitter design may be configured to use an 8-shape VCO inductor to reduce the pulling effect, but this method requires a large area and is not very effective. In another method, a large phase locked loop (PLL) loop-bandwidth may be used; however, this method results in noise degradation and/or a loop stability issue. In accordance with embodiments of the present invention, a pulling effect mitigation circuit is added to a transmitter system to reduce/cancel the pulling effect, thus enhancing the signal transmission quality. Further details of the proposed pulling effect mitigation circuit are described as below.

Figure 1:
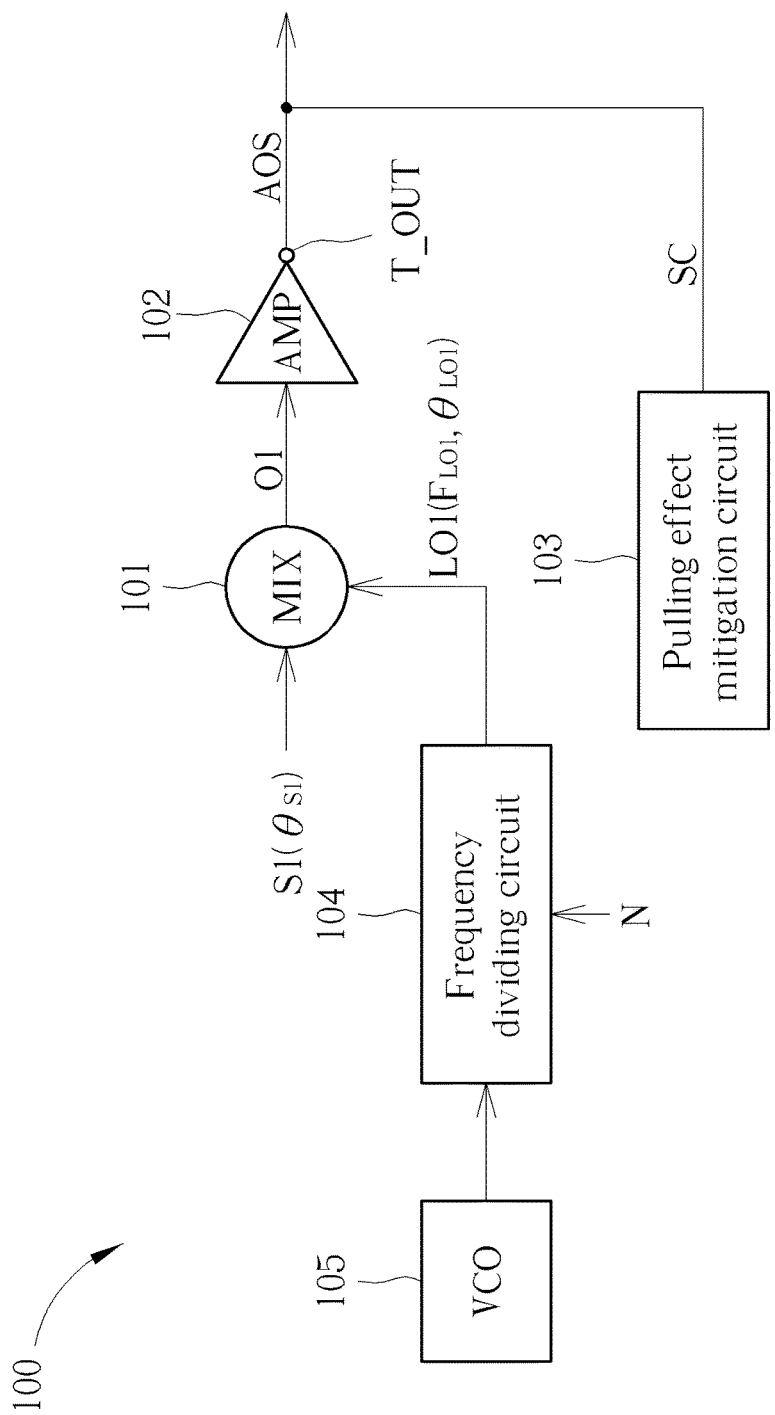
FIG. 1 is a diagram illustrating a signal processing circuit of a transmitter according to an embodiment of the present invention.

FIG. 1 is a diagram illustrating a signal processing circuit 100 of a transmitter according to an embodiment of the present invention. The signal processing circuit 100 is part of the transmitter, and only the components pertinent to technical features of the present invention are shown in FIG. 1. The transmitter may have additional components to achieve other functions. As shown in FIG. 1, the signal processing circuit 100 includes a mixer (MIX) 101, an amplifier (AMP) 102, a pulling effect mitigation circuit 103, a frequency dividing circuit 104 and a clock source (e.g. a VCO 105). The mixer 101 is arranged for mixing (up-converting) an input signal S1 (e.g. a baseband signal) with an oscillation signal (e.g. an LO signal) LO1 to generate an output signal O1. The clock source is arranged for generating a reference clock (e.g. a VCO signal SVCO). The oscillation signal LO1 is derived from the reference clock through frequency division performed at the frequency dividing circuit 104 using a frequency dividing factor N, where the value of N may be a positive integer not smaller than 2. The VCO 105 is configured to operate at a high clock frequency for achieving better noise performance, and hence the oscillation signal LO1 with a frequency $F_{LO1}$ is generated by dividing a frequency $F_{VCO}$ of the VCO signal SVCO with the frequency dividing factor N, where $F_{LO1}=F_{VCO}/N$. The amplifier 102 is coupled to the mixer 101, and is arranged for amplifying the output signal O1 to generate an amplified output signal AOS at an output terminal T_OUT of the amplifier 102.

The pulling effect mitigation circuit 103 is coupled to the output terminal T_OUT of the amplifier 102, and is arranged for generating a compensation signal SC for reducing the $N^{th}$ harmonic of the amplified output signal AOS. The $N^{th}$ harmonic of the amplified output signal AOS has a frequency that is N times the fundamental frequency of the amplified output signal AOS. Ideally, the amplifier 102 adjusts the signal magnitude without changing the signal frequency, so that the fundamental frequency of the amplified output signal AOS is substantially equal to the frequency of the output signal O1 which is close to the frequency $FL_{O1}$ of the oscillation signal LO1. The $N^{th}$ harmonic of the amplified output signal AOS has a frequency close to the frequency $F_{VCO}$ of the VCO signal SVCO generated by the VCO 105, and may affect the VCO signal SVCO through magnetic coupling between a transformer in the transmitter (e.g. a balun (balanced-to-unbalanced) transformer) and an inductor of the VCO 105. The pulling effect mitigation circuit 103 is designed to generate the compensation signal SC which is capable of reducing or cancelling the $N^{th}$ harmonic of the amplified output signal AOS. For example, the amplified output signal AOS is combined with the compensation signal SC at the output terminal T_OUT of the amplifier 102. With proper design of the compensation signal SC, a desired signal component having the fundamental frequency in the amplified output signal AOS can be forwarded to the following signal processing stage, while the $N^{th}$ harmonic of the amplified output signal AOS can be effectively reduced to mitigate the pulling effect.

Figure 2:
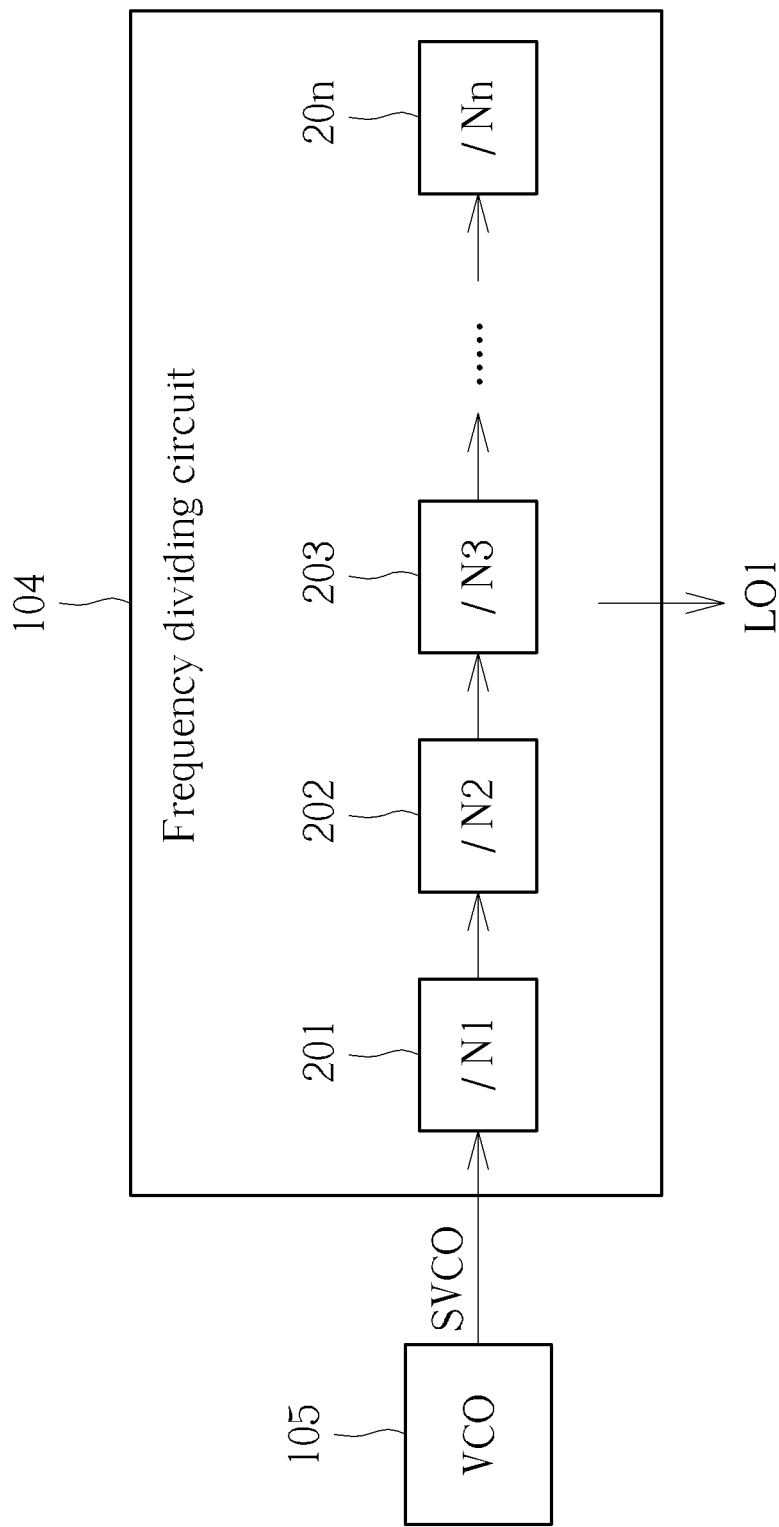
FIG. 2 is a diagram illustrating an example of a frequency dividing circuit shown in FIG. 1.

It should be noted that the harmonic of the amplified output signal that is to be reduced/cancelled by the proposed pulling effect mitigation circuit 103 depends on the frequency dividing factor, which defines a ratio of a frequency of a reference clock frequency to a frequency of a frequency-divided signal. FIG. 2 is a diagram illustrating an example of the frequency dividing circuit 104 shown in FIG. 1. As shown in FIG. 2, the frequency dividing circuit 104 may include one or more frequency dividers 201-20n with frequency dividing factors N1-Nn. The number of frequency dividers implemented in the frequency dividing circuit 104 is based on the application requirement. For example, the frequency dividing circuit 104 may be shared among circuit components with different reference clock frequency requirements. A frequency-divided signal generated from one of the frequency dividers 201-20n may be supplied to one circuit component (e.g. mixer 101) in the transmitter, while a frequency-divided signal generated from another of the frequency dividers 201-20n may be supplied to another circuit component in the same transmitter. In another example, the frequency dividing circuit 104 may be dedicated to the signal processing circuit 100 shown in FIG. 1. In a case where the frequency dividing circuit 104 is implemented using multiple frequency dividers, the oscillation signal LO1 can be extracted from an output of one of the frequency dividers 201-20n according to the needed frequency dividing factor N. For example, when the needed frequency dividing factor N is equal to N1, an output of the frequency divider 201 is used as the oscillation signal LO1. In another example, when the needed frequency dividing factor N is equal to N1*N2, an output of the frequency divider 202 is used as the oscillation signal LO1. These examples are for illustrative purposes only, and are not meant to be limitations of the present invention. Alternatively, the frequency dividing circuit 104 may be implemented using a single frequency divider. In short, any frequency dividing circuit design capable of generating the needed oscillation signal LO1 having a lower frequency from the VCO signal SVCO having a higher frequency may be employed to realize the frequency dividing circuit 104.

For clarity and simplicity, the following assumes that the frequency dividing factor N is equal to 2 (i.e. N=2), such that the frequency $F_{VCO}$ of the VCO signal SVCO is twice as large as the frequency $F_{LO1}$ of the oscillation signal LO1, and the following embodiments of the pulling effect mitigation circuit 103 are discussed assuming that the frequency dividing factor N is 2. It should be noted, however, that the proposed pulling effect mitigation design may be configured to work under a situation where the frequency dividing factor N is a positive value larger than 2. These alternative designs all fall within the scope of the present invention.

Figure 3:
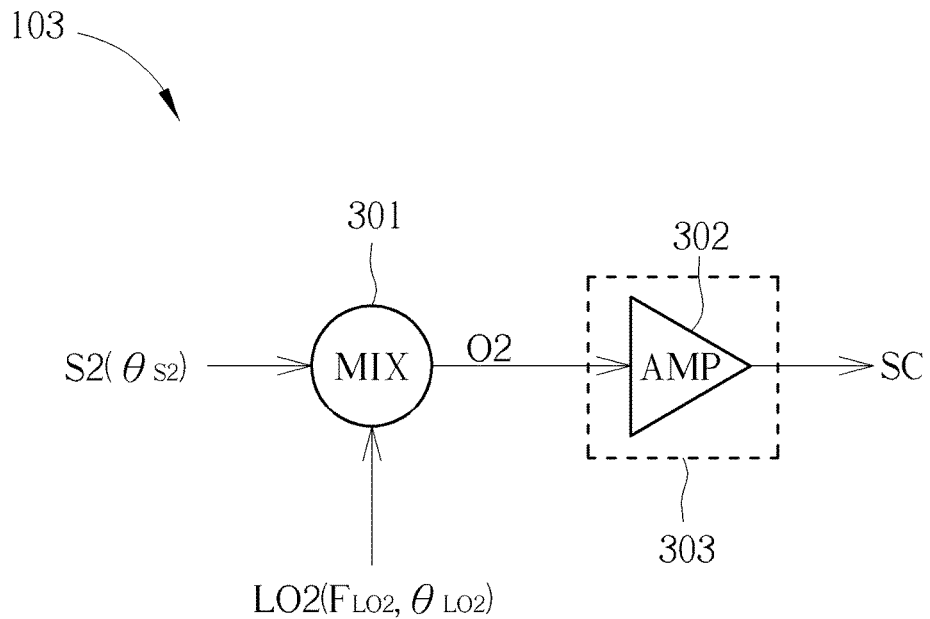
FIG. 3 is a diagram illustrating a pulling effect mitigation circuit according to an embodiment of the present invention.

FIG. 3 is a diagram illustrating a pulling effect mitigation circuit 103 according to an embodiment of the present invention. As shown in FIG. 3, the pulling effect mitigation circuit 103 includes a mixer (MIX) 301 and a compensating unit 303. In this embodiment, the compensating unit 303 may be implemented using an amplifier (AMP) 302. The mixer 301 is arranged for mixing (i.e. up-converting) an input signal S2 with an oscillation signal LO2 to generate an output signal O2. The amplifier 302 is coupled to the mixer 301, and is arranged for amplifying the output signal O2 to generate the compensation signal SC used for reducing the $2^{nd}$ harmonic of the amplified output signal AOS. The behavior of an amplifier may be modeled by the equation $a_1x+a_2x^2$. It can be deduced that, if the output signal O2 has a 90-degree phase difference with the output signal O1, the $2^{nd}$ harmonic of the compensation signal SC and the $2^{nd}$ harmonic of the amplified output signal AOS are out of phase. After the amplifiers 102 and 302 process the output signals O1 and O2, respectively, the $2^{nd}$ harmonic of the amplified output signal AOS generated from amplifying the output signal O1 can be reduced by the compensation signal SC (particularly, the $2^{nd}$ harmonic of the compensation signal SC) which is generated by amplifying the output signal O2.

As mentioned above, it is necessary for the output signal O2 to have a 90-degree phase difference with the output signal O1. In a first embodiment, the input signal S2 is generated by shifting the phase $\theta_{S1}$ of the input signal S1 90 degrees (i.e. $\theta_{S2}=\theta_{S1}+90°$ or $\theta_{S1}-90°$), while the oscillation signal LO2 and the oscillation signal LO1 have the same frequency ($F_{LO2}=F_{LO1}=F_{VCO}/N$) and the same phase ($\theta_{LO2}=\theta_{LO1}$). The oscillation signal LO1 is also provided to the mixer 302 to serve as the oscillation signal LO2.

In a second embodiment, the oscillation signal LO2 is generated by shifting the phase $\theta_{LO1}$ of the oscillation signal LO1 90 degrees (e.g. $\theta_{LO2}=\theta_{LO1}+90°$ or $\theta_{LO1}-90°$), while the input signal S1 is also transmitted to the mixer 301 to serve as the input signal S2 (i.e. S2=S1). The oscillation signals LO1 and LO2 in this case have the same frequency ($F_{LO2}=F_{LO1}=F_{VCO}/N$) but different phases.

The 90-degree phase-shifted input signal and the 90-degree phase-shifted oscillation signal may already be available in the transmitter. Hence, when the proposed pulling effect mitigation circuit 103 is added to the transmitter, no additional circuits are needed to generate these signals. The transmitter may be an IQ-based transmitter having an in-phase (I) path and a quadrature (Q) path. Regarding the first embodiment, the input signal S1 and the oscillation signal LO1 are used by the I path, while the 90-degree phase-shifted input signal S2 is used by the Q path and further supplied to the pulling effect mitigation circuit 103. Regarding the second embodiment, the input signal S1 and the oscillation signal LO1 are used by the I path, while the 90-degree phase-shifted oscillation signal L2 is used by the Q path and further supplied to the pulling effect mitigation circuit 103.

Figure 4:
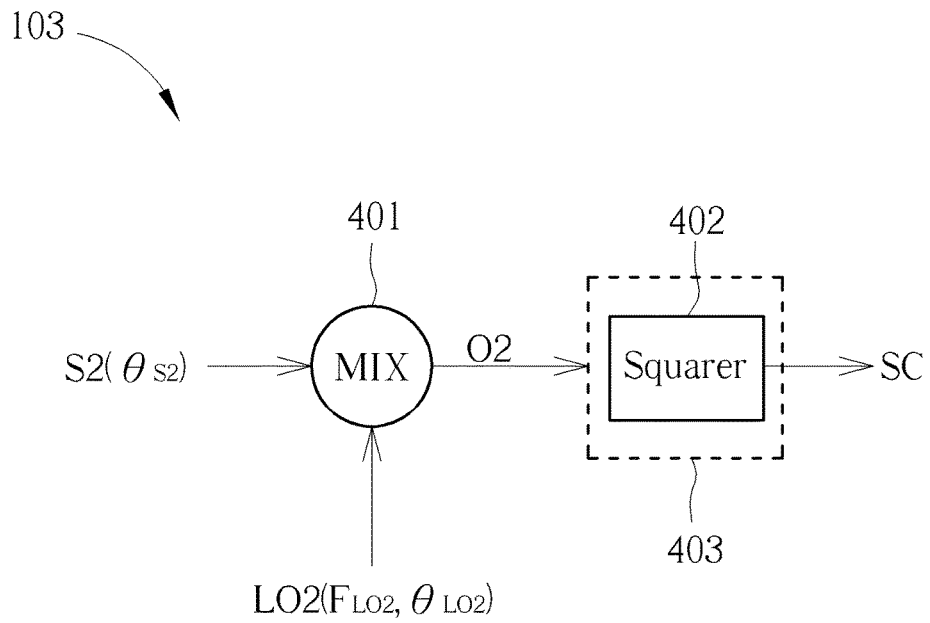
FIG. 4 is a diagram illustrating a pulling effect mitigation circuit according to another embodiment of the present invention.

FIG. 4 is a diagram illustrating a pulling effect mitigation circuit 103 according to another embodiment of the present invention. As shown in FIG. 4, the pulling effect mitigation circuit 103 includes a mixer (MIX) 401 and a compensating unit 403. In this embodiment, the compensating unit 403 may be implemented using a squarer 402. The mixer 401 is the same as the mixer 301, and therefore receives the input signal S2 and the oscillation signal L2 for signal mixing. The squarer 402 is arranged to double the phase of the output signal O2 through a square function $(\cdot)^2$. The behavior of a squarer may be modeled as $x^2$ without the lower-order term "$a_1x$" present in the equation of an amplifier. The output signal O2 is controlled to have a 90-degree phase difference with the output signal O1. After the output signal O1 and the output signal O2 are processed by the amplifier 102 and the squarer 402, respectively, the square function performed by the squarer 402 will make the compensation signal SC have a 180-degree phase difference with the $2^{nd}$ harmonic of the amplified output signal AOS. In other words, the $2^{nd}$ harmonic of the amplified output signal AOS generated from amplifying the output signal O1 can be reduced by the compensation signal SC generated from the squarer 402.

Likewise, in order to make the output signal O2 have a 90-degree phase difference with the output signal O1, either the input signal S2 is phase-shifted 90-degrees from the input signal S1 or the oscillation signal L2 is phase-shifted 90-degrees from the oscillation signal LO1, as detailed in the above description of FIG. 3.

As mentioned above, the output signal O2 is controlled to have a 90-degree phase difference with the output signal O1. In the embodiment shown in FIG. 4, the squarer 402 is modeled by the equation $x^2$, and the compensation signal SC generated from the squarer 402 has no signal component having a frequency equal to a frequency of a fundamental-frequency component of the amplified output signal AOS. Compared to the embodiment shown in FIG. 3, the embodiment shown in FIG. 4 introduces no 3 dB reduction to the fundamental-frequency component of the amplified output signal AOS after the compensation signal SC is combined with the amplified output signal AOS.

In the embodiments of FIG. 3 and FIG. 4, the output signal O2 is generated from up-conversion based on the input signal S2 and the oscillation signal L2, wherein one of the input signal S2 and the oscillation signal L2 is phase-shifted 90-degrees from one of the input signal S1 and the oscillation signal LO1, while the other of the input signal S2 and the oscillation signal L2 is identical to the other of the input signal S1 and the oscillation signal LO1. For example, when the input signal S2 is phase-shifted 90-degrees from the input signal S1, the oscillation signal L2 is identical to the oscillation signal LO1. In another example, when the oscillation signal L2 is phase-shifted 90-degrees from the oscillation signal LO1, the input signal S2 is identical to the input signal S1. This is not a limitation of the present invention, however; as long as the output signal O2 is phase-shifted 90-degrees from the output signal O1, the second harmonic of the amplified output signal AOS can be reduced by using the amplifier 302 in FIG. 3 or the squarer 402 in FIG. 4. In alternative embodiments, the input signal S2 and the oscillation signal L2 can respectively be phase-shifted from the input signal S1 and the oscillation signal L1 by specific degrees to constitute the output signal O2 which is phase-shifted 90-degrees from the output signal O1 through the aforementioned mixer 301/401.

Figure 5:
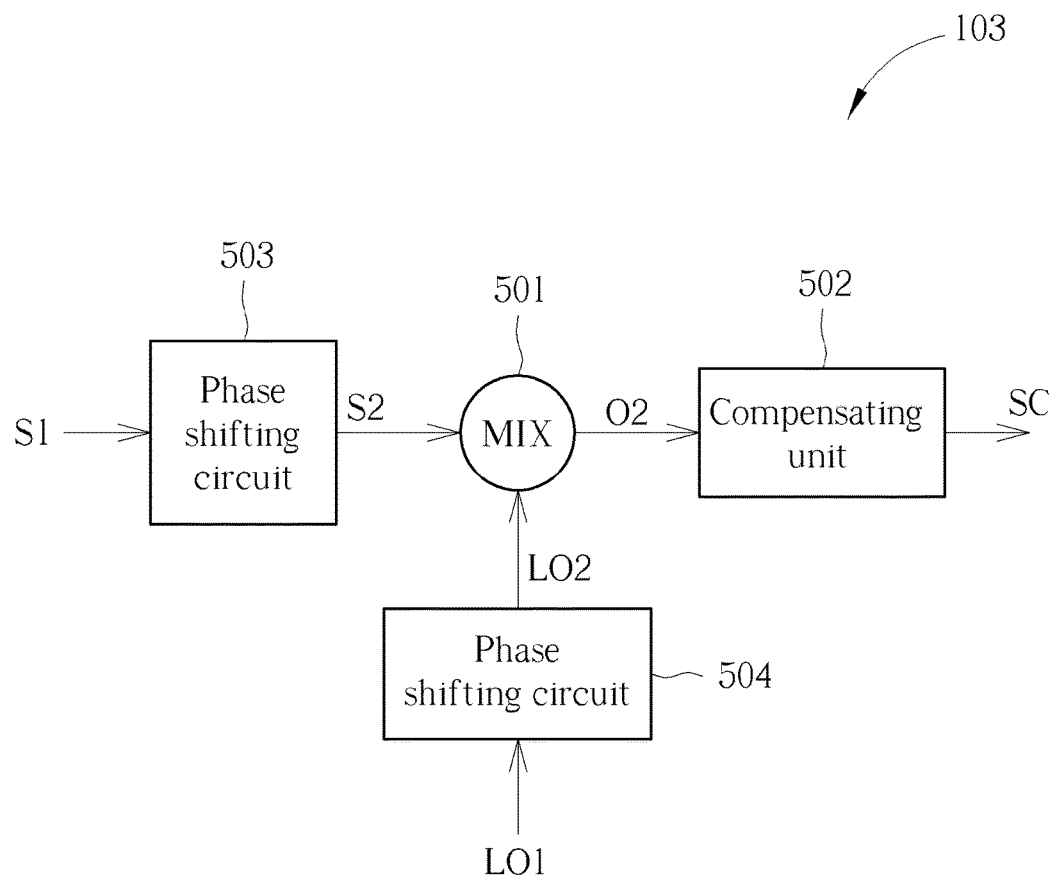
FIG. 5 is a diagram illustrating a pulling effect mitigation circuit according to yet another embodiment of the present invention.

FIG. 5 is a diagram illustrating a pulling effect mitigation circuit according to yet another embodiment of the present invention. The pulling effect mitigation circuit 103 may include a mixer (MIX) 501, a compensating unit 502, and a plurality of phase-shifting circuits 503 and 504. The phase-shifting circuit 503 is arranged to apply a phase shift of A1 degrees to the input signal S1, and generate a phase-shifted input signal (i.e. the input signal S2) to the mixer 501. The phase-shifting circuit 504 is arranged to apply a phase shift of A2 degrees to the oscillation signal LO1, and generate a phase-shifted oscillation signal (i.e. the oscillation signal L2) to the mixer 501. In this embodiment, the sum of A1 and A2 is equal to 90. The input signal S2 is phase-shifted 30-degrees from the input signal S1 and the oscillation signal LO2 is phase-shifted 60-degrees from the oscillation signal LO1, resulting in the output signal O2 that is phase-shifted 90-degrees from the output signal O1 due to signal mixing performed at the mixer 501. The mixer 501 may be the same as the mixer 301 shown in FIG. 3 or the mixer 401 shown in FIG. 4. The compensating unit 502 may be implemented using the amplifier 302 shown in FIG. 3 or the squarer 402 shown in FIG. 4, as long as the same objective of reducing the $2^{nd}$ harmonic of the amplified output signal AOS can be achieved.

As mentioned above, the 90-degree phase-shifted input signal and the 90-degree phase-shifted oscillation signal may already be available in the transmitter (e.g. an IQ-based transmitter), and therefore no additional circuits are needed to generate a 90-degree phase-shifted oscillation signal or a 90-degree phase-shifted input signal to the mixer 301/401. In a case where the 90-degree phase-shifted input signal and the 90-degree phase-shifted oscillation signal are not available in the transmitter, however, the pulling effect mitigation circuit 103 shown in FIG. 5 may be employed. The phase-shifting circuit 503 may be arranged to apply a phase shift of 90-degrees to the input signal S1, and generate the input signal S2 that is phase-shifted 90-degrees from the input signal S1; and the phase-shifting circuit 504 may be arranged to apply a zero-degree phase shift to the oscillation signal LO1, and output the oscillation signal LO1 as the oscillation signal L2. In another example, the phase-shifting circuit 503 may be arranged to apply a zero-degree phase shift to the input signal S1, and output the input signal S1 as the input signal S2; and the phase-shifting circuit 504 may be arranged to apply a 90-degree phase shift to the oscillation signal LO1, and generate the oscillation signal L2 that is phase-shifted 90-degrees from the oscillation signal LO1. These alternative designs all fall within the scope of the present invention.

In the embodiments of FIG. 3, FIG. 4 and FIG. 5, the pulling effect mitigation circuit 103 may operate under the condition that the frequency dividing factor N is 2. Hence, the pulling effect mitigation circuit 103 may generate the compensation signal SC to reduce the $2^{nd}$ harmonic of the amplified output signal AOS. The same pulling effect mitigation concept may also work under the condition that the frequency dividing factor is any positive integer larger than 2. For example, the frequency $F_{VCO}$ of the VCO signal SVCO may be three times as large as the frequency $F_{LO1}$ of the oscillation signal LO1 when the frequency dividing factor N is set to 3, or may be four times as large as the frequency $F_{LO1}$ of the oscillation signal LO1 when the frequency dividing factor N is set to 4. Therefore, the compensation signal SC should be able to reduce a higher-order harmonic of the amplified output signal AOS for pulling effect mitigation.

If the frequency dividing factor N is 3 (i.e. the frequency $F_{VCO}$ of the VCO signal SVCO is three times as large as the frequency $F_{LO1}$ of the oscillation signal LO1), the compensation signal SC generated from the pulling effect mitigation circuit 103 is intended to reduce the $3^{rd}$ harmonic of the amplified output signal AOS for mitigating the pulling effect. If the frequency dividing factor N is 4 (i.e. the frequency $F_{VCO}$ of the VCO signal SVCO is four times as large as the frequency $F_{LO1}$ of the oscillation signal LO1), the compensation signal SC generated from the pulling effect mitigation circuit 103 is intended to reduce the $4^{th}$ harmonic of the amplified output signal AOS for mitigating the pulling effect.

When the frequency dividing factor N is set by a positive value larger than 2 (i.e. N≠2), the output signal O2 should be properly controlled to have a phase shift of 180/N degrees with the output signal O1, and the compensation unit 303/403/502 should be properly designed to make the phase of the compensation signal SC have a 180-degree phase difference with the $N^{th}$ harmonic of the amplified output signal AOS. As long as the output signal O2 has an 180°/N phase difference with the output signal O1, and a compensating unit can multiply the phase of the output signal O2 by N, the compensation signal SC will include a signal component having a 180-degree phase difference with the $N^{th}$ harmonic of the amplified output signal AOS. In this way, the same objective of mitigating the pulling effect can be achieved.

For example, if the dividing factor N is 3, as long as the output signal O2 has a 60-degree phase difference with the output signal O1 and a compensating unit cubes the output signal O2 (multiplies the phase of the output signal O2 by 3), the $3^{rd}$ harmonic of the amplified output signal AOS can be reduced by the compensation signal SC. In another example, if the dividing factor N is 4, as long as the output signal O2 has a 45-degree phase difference with the output signal O1 and a compensating unit multiplies the phase of the output signal O2 by 4, the $4^{th}$ harmonic of the amplified output signal AOS can be reduced by the compensation signal SC. In such cases, the output signal S2 and the oscillation signal L2 can be phase shifted from the output signal S1 and the oscillation LO1, respectively, by any degree as long as the output signal O2 has a 180/N-degree phase difference with the output signal O1. The compensating unit 403/502 may be modified to employ an operator arranged to generate the $N^{th}$ power of the output signal O2 (i.e. $(O2)^N$) as the compensation signal SC. One skilled in this art should understand the operation after reading the embodiments described above, and a detailed description is therefore omitted here for brevity.

Briefly summarizing the present invention, a signal processing circuit and associated method is disclosed for mitigating an un-wanted harmonic of a data signal to be transmitted by providing an auxiliary path. In this way, the current loop at the un-wanted harmonic can be minimized, and an area of a capacitor at a central tap in a transmitter system can be removed or considerably reduced. Moreover, the noise requirement for the auxiliary path is loose and the device can be chosen to minimize the loading effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A transmitter, comprising:
a first mixer, arranged to upconvert a first input signal with an oscillation signal to generate a first output signal, wherein the oscillation signal is generated by dividing a frequency of a reference clock with a frequency dividing factor;
a first amplifier, coupled to the first mixer, the first amplifier arranged to amplify the first output signal and generate an amplified output signal at an output terminal of the first amplifier; and
a pulling effect mitigation circuit, coupled to the output terminal of the first amplifier, the pulling effect mitigation circuit arranged to generate a compensation signal, to the output terminal for reducing at least an $N^{th}$ harmonic of the amplified output signal, the pulling effect mitigation circuit comprising:
a first phase shifting circuit, configured to shift a phase of the first input signal and output a phase shifted first input signal, the phase shifted first input signal having a different phase from that of the first input signal;
a second phase shifting circuit, configured to shift a phase of the oscillation signal to produce a phase shifted oscillation signal, the phase shifted oscillation signal having a different phase from that of the oscillation signal; and
a second mixer, coupled to the first phase shifting circuit, configured to mix the phase shifted first input signal with the phase shifted oscillation signal to generate a second output signal, wherein a frequency of the phase shifted oscillation signal is equal to a frequency of the oscillation signal, and wherein a sum of the phase shifts produced by the first and second phase shifting circuits is 90 degrees;
wherein a value of N is equal to the frequency dividing factor, such that the compensation signal reduces at least the Nth harmonic of the amplifier output signal to prevent the amplified output signal from affecting the frequency of the oscillation signal.

2. The transmitter of claim 1, wherein the pulling effect mitigation circuit comprises:
a compensating unit, coupled to the second mixer, the compensating unit arranged to generate the compensation signal according to the second output signal, wherein the compensating unit makes a phase of an $N^{th}$ harmonic of the compensation signal have a 180-degree difference with a phase of the amplified output signal.

3. The transmitter of claim 1, wherein the second output signal is phase-shifted from the first output signal.

4. The transmitter of claim 3, wherein the second output signal is phase-shifted 90 degrees from the first output signal.

5. The transmitter of claim 1, wherein the first phase shifting circuit introduces a phase shift of 30 degrees and the second phase shifting circuit introduces a phase shift of 60 degrees.

6. A signal processing method, comprising:
   upconverting a first input signal with an oscillation signal to generate a first output signal, wherein the oscillation signal is generated by dividing a frequency of a reference clock with a frequency dividing factor;
   amplifying the first output signal to generate a first amplified output signal;
   phase shifting the first input signal by a first phase shift to generate a phase shifted first input signal, the phase shifted first input signal having a different phase from that of the first input signal;
   phase shifting the oscillation signal by a second phase shift to generate a phase shifted oscillation signal, the phase shifted oscillation signal having a different phase from that of the oscillation signal, wherein a sum of the first phase shift and the second phase shift is equal to 90 degrees;
   mixing the phase shifted first input signal with the phase shifted oscillation signal to generate a second output signal, wherein a frequency of the phase shifted oscillation signal is equal to a frequency of the oscillation signal;
   generating a compensation signal; and
   combining the first amplified output signal and the compensation signal for reducing at least an $N^{th}$ harmonic of the first amplified output signal to prevent the first amplified output signal from affecting the frequency of the oscillation signal;
   wherein a value of N is equal to the frequency dividing factor.

7. The signal processing method of claim 6, wherein generating the compensation signal comprises:
   generating the compensation signal according to the second output signal, wherein a phase of an $N^{th}$ harmonic of the compensation signal has a 180-degree difference with a phase of the first input signal.

8. The signal processing method of claim 6, wherein the second output signal is phase-shifted from the first output signal.

9. The signal processing method of claim 8, wherein the second output signal is phase-shifted 90 degrees from the first output signal.

10. The signal processing method of claim 6, wherein the first phase shift is 30 degrees and the second phase shift is 60 degrees.

\* \* \* \* \*